US012730952B2

(12) United States Patent
Wu

(10) Patent No.: US 12,730,952 B2
(45) Date of Patent: Sep. 8, 2026

(54) METHOD FOR DETERMINING PERFORMANCE OF SEQUENTIAL LOGIC ELEMENTS AND DEVICE

(71) Applicant: Changxin Memory Technologies, Inc., Hefei (CN)

(72) Inventor: Zengquan Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 852 days.

(21) Appl. No.: 18/094,100

(22) Filed: Jan. 6, 2023

(65) Prior Publication Data

US 2023/0419008 A1 Dec. 28, 2023

Related U.S. Application Data

(63) Continuation of application No. PCT/CN2022/103203, filed on Jun. 30, 2022.

(30) Foreign Application Priority Data

Jun. 22, 2022 (CN) ........................ 202210711774.X

(51) Int. Cl.
*G06F 30/3308* (2020.01)
*G06F 30/20* (2020.01)
(Continued)

(52) U.S. Cl.
CPC ...... *G06F 30/3308* (2020.01); *G06F 30/3323* (2020.01); *G06F 30/20* (2020.01);
(Continued)

(58) Field of Classification Search
CPC ............. G06F 30/3308; G06F 30/3323; G06F 30/3312; G06F 30/3315; G06F 30/367; G06F 30/396; G06F 30/398; G06F 30/20
(Continued)

(56) References Cited

U.S. PATENT DOCUMENTS 6,557,150 B1 * 4/2003 Honmura ................ G06F 30/33 716/113
6,751,744 B1 * 6/2004 Allen .................. G06F 30/3323 716/112

(Continued)

FOREIGN PATENT DOCUMENTS

CN 105447213 A 3/2016
CN 112417798 A 2/2021

(Continued)

OTHER PUBLICATIONS

PCT International Search Report and the Written Opinion mailed Dec. 26, 2022, issued in related International Application No. PCT/CN2022/103203, with English translation (17 pages).

(Continued)

*Primary Examiner* — Phallaka Kik
(74) *Attorney, Agent, or Firm* — Sheppard Mullin Richter & Hampton LLP

(57) ABSTRACT

A method for determining performance of sequential logic elements includes the following operations. To check a circuit, a performance check file corresponding to each of the sequential logic elements of the circuit is obtained; and the circuit is separately simulated to obtain the simulation result, by using a plurality of simulation waveforms, based on the performance check file corresponding to each of the sequential logic elements. The performance check file may be used to determine, in a simulation process, whether a target characteristic parameter of each of the sequential logic elements meets a preset condition, and identification information of a target sequential logic element having a target characteristic parameter that does not meet the preset condition is output in the simulation result.

12 Claims, 4 Drawing Sheets

(51) Int. Cl.

| | |
|---|---|
| ***G06F 30/3312*** | (2020.01) |
| ***G06F 30/3315*** | (2020.01) |
| ***G06F 30/3323*** | (2020.01) |
| ***G06F 30/367*** | (2020.01) |
| ***G06F 30/396*** | (2020.01) |

(52) U.S. Cl.
CPC ...... *G06F 30/3312* (2020.01); *G06F 30/3315* (2020.01); *G06F 30/367* (2020.01); *G06F 30/396* (2020.01)

(58) Field of Classification Search
USPC ........ 716/106, 108, 109, 112, 113, 115, 134, 716/136; 703/16, 18
See application file for complete search history.

(56) References Cited

U.S. PATENT DOCUMENTS

| | | | | |
|---|---|---|---|---|
| 7,076,415 | B1 * | 7/2006 | Demler | G06F 30/327 716/132 |
| 7,490,307 | B2 | 2/2009 | Fomaciari et al. | |
| 8,078,997 | B2 * | 12/2011 | Lapanik | H01L 22/12 716/54 |
| 8,843,863 | B2 * | 9/2014 | Kobayashi | G06F 30/367 716/132 |
| 10,936,776 | B1 * | 3/2021 | Lin | G06F 8/71 |
| 2009/0119542 | A1 * | 5/2009 | Nagashima | G06F 11/261 714/33 |
| 2018/0365367 | A1 * | 12/2018 | Kerr | G06F 30/392 |
| 2021/0110096 | A1 * | 4/2021 | Pu | G06F 30/367 |
| 2021/0232742 | A1 | 7/2021 | Korchemny et al. | |
| 2023/0152878 | A1 * | 5/2023 | Calugaru | G06F 1/3296 713/320 |

FOREIGN PATENT DOCUMENTS

| | | | | |
|---|---|---|---|---|
| CN | 113723045 | A | | 11/2021 |
| CN | 114548006 | A | | 5/2022 |
| JP | H08-221456 | A | | 8/1996 |
| JP | 2000293555 | A | * | 10/2000 |
| JP | 2001-306646 | A | | 11/2001 |
| JP | 2011158965 | A | * | 8/2011 |

OTHER PUBLICATIONS

First Office Action and Search Report dated Jul. 1, 2026, issued in Chinese Patent Application No. 20221011774.X, with English machine translation (16 pages).

Guobin Liu et al., “Application of Latch—Based STA Analysis in Independent Verification,” Computer Measurement & Control, 09, Sep. 25, 2017, with English language abstract.

* cited by examiner

METHOD FOR DETERMINING PERFORMANCE OF SEQUENTIAL LOGIC ELEMENTS AND DEVICE

CROSS-REFERENCE TO RELATED APPLICATIONS

This application is a continuation application of International Patent Application No. PCT/CN2022/103203, filed on Jun. 30, 2022, which claims priority to Chinese Patent Application No. 202210711774.X, filed with the China National Intellectual Property Administration on Jun. 22, 2022 and entitled "METHOD FOR DETERMINING PERFORMANCE OF SEQUENTIAL LOGIC ELEMENTS AND DEVICE". The above-referenced applications are incorporated herein by reference in their entirety.

TECHNICAL FIELD

Embodiments of the present invention relate to the field of semiconductor technologies, and in particular, to a method for determining performance of sequential logic elements and a device.

BACKGROUND

Currently, to make a standard cell library-based application-specific integrated circuit (ASIC) design, a characteristic parameter (for example, a setup time or a hold time) of sequential logic elements such as a flip-flop or a latch is usually analyzed through a static timing analysis (STA).

However, in a design process of a fully-customized integrated circuit, it is difficult to determine the characteristic parameter of the sequential logic elements, and it generally needs a manual check, which is time and labor consuming, and degrades efficiency of designing the integrated circuit.

SUMMARY

Embodiments of the present invention provide a method for determining performance of sequential logic elements and a device, to quickly determining of a characteristic parameter of the sequential logic elements, and improve efficiency of designing an integrated circuit.

According to a first aspect, an embodiment of the present invention provides a method for determining performance of sequential logic elements of a circuit under simulation, the method including: obtaining a performance check file corresponding to each of the sequential logic elements; and separately simulating to obtain a simulation result, by using a plurality of simulation waveforms, the circuit based on the performance check file corresponding to each of the sequential logic elements, where the performance check file is used to check, in a simulation process, whether a target characteristic parameter of each of the sequential logic elements meets a preset condition, and where identification information of a target sequential logic element having a target characteristic parameter that does not meet the preset condition is output in the simulation result.

In a feasible implementation, before the obtaining a performance check file corresponding to each of the sequential logic elements, the method further includes: generating a netlist corresponding to the circuit based on a design database of the circuit; searching the netlist corresponding to the circuit for each of the sequential logic elements based on a preset keyword; and configuring the performance check file corresponding to each of the sequential logic elements.

In a feasible implementation, after the simulation result is obtained, the method further includes: determining a smallest target characteristic parameter corresponding to target sequential logic elements on a same path in the simulation result and a target simulation waveform corresponding to the smallest target characteristic parameter; and determining, based on the target simulation waveform, whether a timing error exists in the target sequential logic elements on the same path.

In a feasible implementation, after the determining whether a timing error exists in the target sequential logic elements on the same path, the method further includes: adjusting an input signal of the target sequential logic elements on the same path when it is determined that a timing error exists in the target sequential logic elements on the same path.

In a feasible implementation, the sequential logic elements include a flip-flop and/or latch; and the target characteristic parameter includes a setup time and/or a hold time.

In a feasible implementation, the adjusting an input signal of the target sequential logic elements on the same path includes: adjusting a clock signal and/or a data input signal corresponding to the target sequential logic elements on the same path. According to a second aspect, an embodiment of the present invention provides an apparatus for determining performance of sequential logic elements of a circuit, the apparatus including: an obtaining module, configured to obtain a performance check file corresponding to each of the sequential logic elements; and a simulation module, configured to separately simulate to obtain a simulation result, by using a plurality of simulation waveforms, the circuit based on the performance check file corresponding to each of the sequential logic elements, where the performance check file is used to check, in a simulation process, whether a target characteristic parameter of each of the sequential logic elements meets a preset condition, and where identification information of a target sequential logic element having a target characteristic parameter that does not meet the preset condition is output in the simulation result.

In a feasible implementation, the apparatus further includes a configuration module, configured to: generate a netlist corresponding to the circuit based on a design database of the circuit; search the netlist corresponding to the circuit for each of the sequential logic elements based on a preset keyword; and configure the performance check file corresponding to each of the sequential logic elements.

In a feasible implementation, the apparatus further includes a processing module, configured to: determine a smallest target characteristic parameter corresponding to target sequential logic elements on a same path in the simulation result and a target simulation waveform corresponding to the smallest target characteristic parameter; and determine, based on the target simulation waveform, whether a timing error exists in the target sequential logic elements on the same path.

In a feasible implementation, the apparatus further includes an adjustment module, configured to: adjust an input signal of the target sequential logic elements on the same path when it is determined that a timing error exists in the target sequential logic elements on the same path.

In a feasible implementation, the sequential logic elements include a flip-flop and/or latch; and the target characteristic parameter includes a setup time and/or a hold time.

In a feasible implementation, the adjustment module is specifically configured to: adjust a clock signal and/or a data input signal corresponding to the target sequential logic elements on the same path. According to a third aspect, an embodiment of the present invention provides an electronic device, including at least one processor and a memory, where the memory stores computer-executable instructions; and the at least one processor executes the computer-executable instructions stored in the memory, so that the at least one processor performs the method for determining performance of sequential logic elements according to the first aspect.

According to a fourth aspect, an embodiment of the present invention provides a computer-readable storage medium. The computer-readable storage medium stores computer-executable instructions, and when a processor executes the computer-executable instructions, the method for determining performance of sequential logic elements according to the first aspect is implemented.

According to a fifth aspect, an embodiment of the present invention provides a computer program product, including a computer program. When the computer program is executed by a processor, the method for determining performance of sequential logic elements according to the first aspect is implemented.

According to the method for determining performance of sequential logic elements and the device in embodiments of the present invention, to check the circuit, the performance check file corresponding to each of sequential logic elements of the circuit is obtained; and the circuit is separately simulated to obtain the simulation result, by using the plurality of simulation waveforms based on the performance check file corresponding to each of the sequential logic elements. The performance check file may be used to determine, in the simulation process, whether the target characteristic parameter of each of the sequential logic elements meets the preset condition, and the identification information of the target sequential logic element having the target characteristic parameter that does not meet the preset condition is output in the simulation result. Compared with a manual check manner, techniques provided in the present invention not only save time and labor, but also provide higher accuracy, so that efficiency of designing an integrated circuit can be effectively improved.

DESCRIPTION OF EMBODIMENTS

Figure 1:
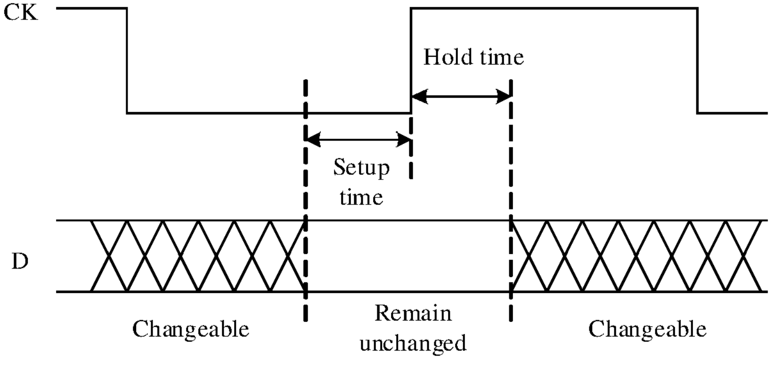
FIG. 1 is a schematic diagram of a setup time and a hold time of sequential logic elements according to an embodiment of the present invention.

To make the objectives, technical solutions, and advantages of embodiments of the present invention clear, the following describes the technical solutions in embodiments of the present invention with reference to the accompanying drawings in embodiments of the present invention. Apparently, the described embodiments are merely some rather than all of embodiments of the present invention. All other embodiments obtained by a person of ordinary skill in the art based on embodiments of the present invention without creative efforts shall fall within the protection scope of the present invention. In addition, although disclosed content of the present invention is described based on one or several example embodiments, it should be understood that various aspects of the disclosed content may also constitute a complete implementation independently.

It should be noted that brief description of terms in the present invention is merely intended to facilitate understanding of the following described implementations, and does not limit the implementations of the present invention. Unless otherwise stated, these terms shall be understood based on ordinary and customary meanings of the terms.

In the specification, claims, and accompanying drawings of the present disclosure, the terms such as "first" and "second" are intended to distinguish between similar or objects or entities, but do not necessarily indicate a specific order or sequence, unless otherwise specified. It should be understood that terms used in this way are interchangeable in a proper case, so that embodiments of the present invention described herein can be implemented in an order other than the order illustrated or described in embodiments of the present invention.

In addition, terms "include" and "have" and any other variants mean to cover non-exclusive inclusion, for example, a product or device that includes a series of components is not necessarily limited to those expressly listed components, but may include another component not expressly listed or inherent to the product or device.

The term "module" used in embodiments of the present disclosure is any known or later developed combination of hardware, software, firmware, artificial intelligence, fuzzy logic, or hardware or/and software code, and can perform a function related to an element.

In the field of semiconductor technologies, in a standard cell library-based ASIC design procedure, a chip designer designs a chip by using a hardware description language, to be specific, models a chip function, synthesizes design code into a standard cell circuit by using automatic design software, and converts, by using a physical back-end design, the standard cell circuit into a graphic data stream (GDS) layout. Finally, a foundry produces the chip.

When the standard cell library-based ASIC design is made, the foundry usually provides a process design kit (PDK) in advance. The PDK includes a design and a characteristic parameter (for example, a setup time or a hold time) of some sequential logic elements.

In some embodiments, the sequential logic element may be a latch, a flip-flop (FF), or the like.

The latch is a pulse level sensitive memory cell circuit, and may change a state under an action of a specific input pulse level. The latch temporarily stores a signal, to maintain a specific level state, and may record binary digital signals "0" and "1" in a digital circuit.

The flip-flop, also referred to as a bistable gate, is a component that has two stable states and that is used for storing, and may record the binary digital signals "1" and "0". An output of the flip-flop is determined based on a data input at a moment specified by an input clock.

The setup time of the sequential logic element is the shortest time period in which a data input end signal needs to remain stable before an active clock edge. The hold time is the shortest time period in which a data input end signal needs to remain stable after the active clock edge.

It can be understood that, in an ideal case, valid data arrives when the active clock edge arrives (before or while the active clock edge arrives), the sequential logic element can correctly collect data. After (or while) the active clock edge arrives, even if data changes, an output of the sequential logic element is not affected.

However, in an actual case, it takes time to close a switch at a clock edge, and it also takes time to change a state of a logic gate (charge/discharge a capacitor, or the like). Therefore, it takes a specific period of time to collect data, and data cannot change in this period of time. In other words, before the active clock edge arrives, data needs to be "prepared in advance" by a minimum amount of time. The minimum amount of time is the setup time. In addition, it also takes time to open the switch at the clock edge. If data changes in this time period, new data may be transferred to a next stage, and an error occurs. Therefore, data needs to remain unchanged for a specific period of time. In other words, after the active clock edge arrives, data needs to remain "unchanged" for a minimum amount of time. The minimum amount of time is the hold time.

To better understand embodiments of the present invention, FIG. 1 is provided. FIG. 1 is a schematic diagram of a setup time and a hold time of sequential logic elements according to an embodiment of the present invention.

In FIG. 1, before a rising edge of a clock signal CK arrives, a data signal D needs to be "prepared in advance" by a minimum amount of time, and cannot change. The minimum amount of time is the setup time. In addition, after the rising edge of the clock signal CK arrives, the data signal D still needs to remain unchanged for a minimum amount of time. The minimum amount of time is the hold time.

Currently, in a design process of a fully-customized integrated circuit, it is difficult to determine a characteristic parameter of the sequential logic elements, and it generally needs a manual check, which is time and labor consuming, and degrades efficiency of designing the integrated circuit.

An embodiment of the present invention provides a method for determining performance of sequential logic elements. To check a circuit under simulation, a performance check file corresponding to each of the sequential logic elements of the circuit is obtained; and the circuit is separately simulated to obtain the simulation result, by using a plurality of simulation waveforms, based on the performance check file corresponding to each of the sequential logic elements. The performance check file may be used to determine, in a simulation process, whether a target characteristic parameter of each of the sequential logic elements meets a preset condition, and identification information of a target sequential logic element having a target characteristic parameter that does not meet the preset condition is output in the simulation result. Compared with a manual check manner, techniques in the present invention not only save time and labor, but also provide higher accuracy, so that efficiency of designing an integrated circuit can be effectively improved.

Figure 2:
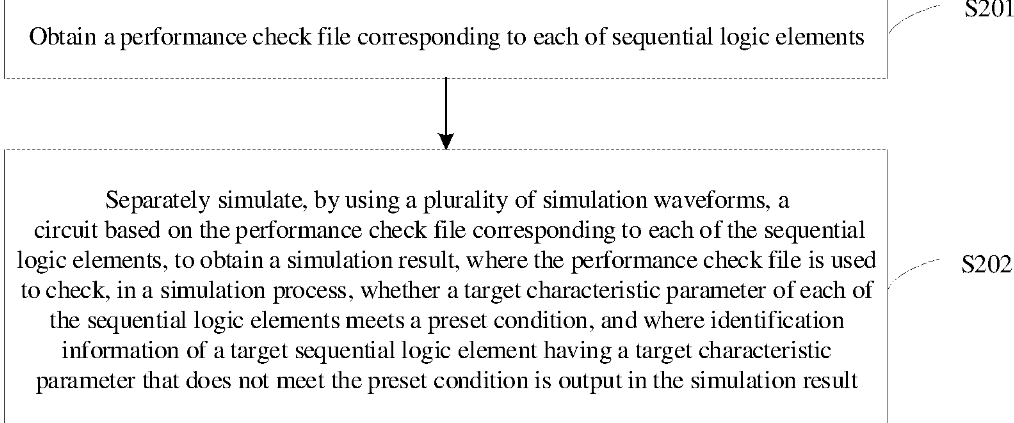
FIG. 2 is a schematic flowchart of steps of a method for determining performance of sequential logic elements according to an embodiment of the present invention.

FIG. 2 is a schematic flowchart of steps of a method for determining performance of sequential logic elements according to an embodiment of the present invention. In some embodiments of the present invention, the method for determining performance of sequential logic elements may be applied to a circuit, where the circuit includes a plurality of sequential logic elements, and the method for determining performance of sequential logic elements includes the following steps.

S201: Obtain a performance check file corresponding to each of the sequential logic elements.

In some implementations, a test platform may be established in advance, the circuit is simulated by using software on the test platform, and the circuit includes at least one sequential logic element.

The sequential logic element may sample an input data signal based on a clock signal.

In some embodiments, the sequential logic element may be a latch, a flip-flop, or the like. The present invention is not limited to these examples. Other sequential logic elements are contemplated.

In some implementations, the performance check file corresponding to each of the sequential logic elements may be pre-configured. The performance check file may be used to monitor an output signal of each of the sequential logic elements in a simulation process, and determine whether the output signal of each of the sequential logic elements satisfies an output expectation.

S202: Separately simulate to obtain a simulation result, by using a plurality of simulation waveforms, the circuit based on the performance check file corresponding to each of the sequential logic elements, where the performance check file is used to check, in the simulation process, whether a target characteristic parameter of each of the sequential logic elements meets a preset condition, and where identification information of a target sequential logic element having a target characteristic parameter that does not meet the preset condition is output in the simulation result.

The simulation waveform includes a clock signal and an input data signal.

In some implementations, a plurality of different clock signals and input data signals may be selected in advance, and the circuit may be simulated for a plurality of times by using a specific simulation tool based on the performance check file corresponding to each of the sequential logic elements.

Different simulation waveforms correspond to different clock signals and/or input data signals.

In the simulation process of the circuit, each of the sequential logic elements may sample the input data signal based on the clock signal.

For explanation purpose, it is assumed that the target characteristic parameter of each of the sequential logic elements is a setup time (Setup Time). The setup time is a time difference between a target edge of the clock signal and a target edge of a target sampling value in the input data signal.

It can be understood that when a setup time of a sequential logic element is less than a general setup time corresponding to the sequential logic element, the sequential logic element may output a reverse value of the target sampling value because the sequential logic element cannot collect the target sampling value, or output the target sampling value with a long delay.

In some embodiments of the present invention, output data of the sequential logic element or an output delay of the sequential logic element may be monitored, and then is compared with output data or an output delay threshold specified in the performance check file corresponding to the sequential logic element. If the output data of the sequential logic element is different from the output data specified in the performance check file corresponding to the sequential logic element, or the output delay of the sequential logic element is greater than the output delay threshold specified in the performance check file corresponding to the sequential logic element, it may be considered that the setup time of the sequential logic element does not meet the preset condition.

In some implementations, in the simulation process of the circuit, when any sequential logic element determines that a target characteristic parameter corresponding to the sequential logic element does not meet the preset condition, identification information corresponding to the sequential logic element is output in the simulation result, so that a design engineer views the identification information or performs one-step screening.

According to the method for determining performance of sequential logic elements in this embodiment of the present invention, to check the circuit, the performance check file corresponding to each of the sequential logic elements of the circuit is obtained; and the circuit is separately simulated to obtain the simulation result, by using the plurality of simulation waveforms, based on the performance check file corresponding to each of the sequential logic elements. The performance check file may be used to determine, in the simulation process, whether the target characteristic parameter of each of the sequential logic elements meets the preset condition, and the identification information of the target sequential logic element having the target characteristic parameter that does not meet the preset condition is output in the simulation result. Compared with a manual check manner, techniques in the present invention not only save time and labor are saved, but also provide higher accuracy, so that efficiency of designing an integrated circuit can be effectively improved.

Figure 3:
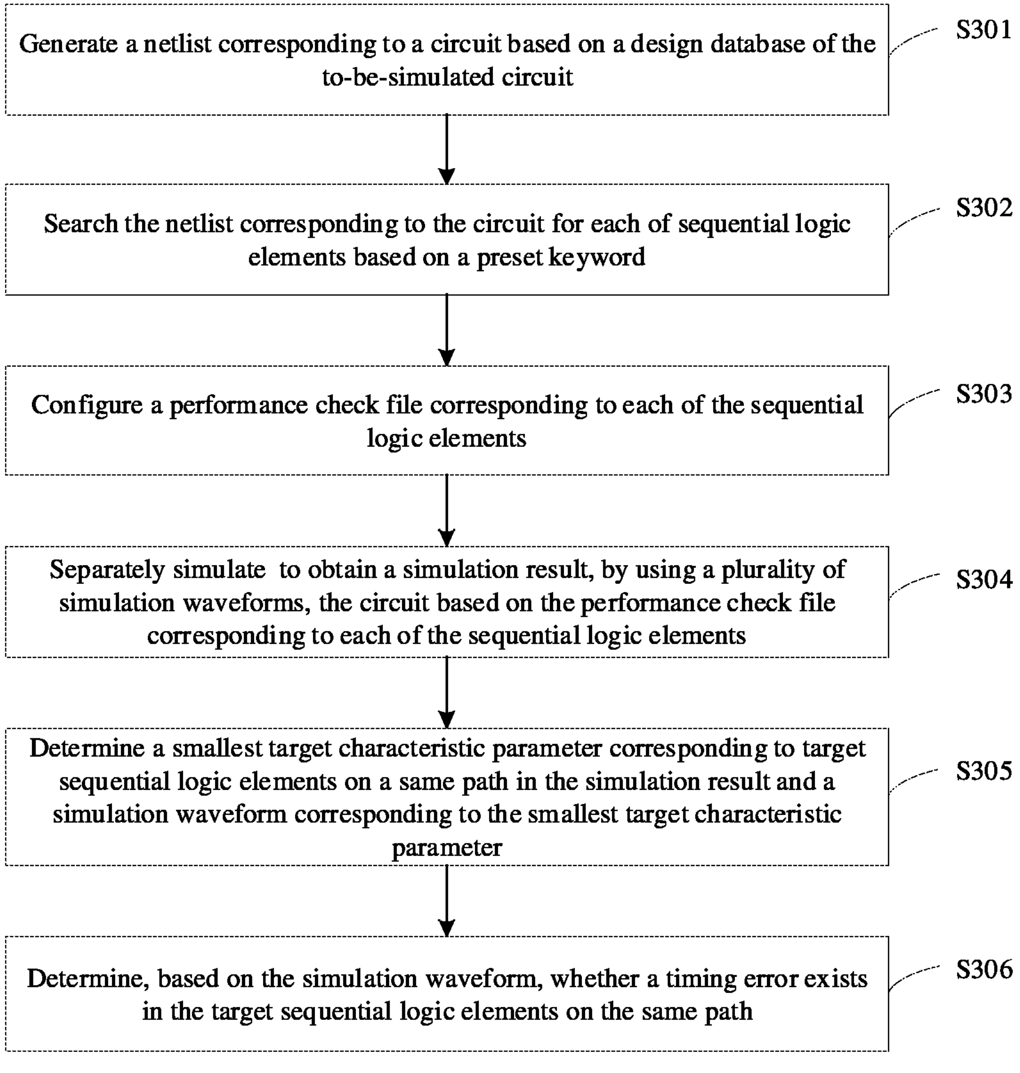
FIG. 3 is a schematic flowchart of steps of another method for determining performance of sequential logic elements according to an embodiment of the present invention.

FIG. 3 is a schematic flowchart of steps of another method for determining performance of sequential logic elements according to an embodiment of the present invention. In some embodiments of the present invention, the method for determining performance of sequential logic elements includes the following steps.

Step S301: Generate a netlist corresponding to a circuit based on a design database of the circuit.

In some embodiments of the present invention, a chip design procedure is used as an example. A purpose, a specification, and performance of the chip are defined in a chip design stage. A chip design may include processes such as a function definition, a system-level design, a front-end design, and a back-end design.

The function definition describes a requirement for a chip function and a performance parameter. The system-level design includes designs of defining a chip architecture, a service module, a power supply, and the like based on the early function definition. During the front-end design, a designer designs a specific circuit for each module based on a solution determined based on the system-level design, describes register transfer level (register transfer level, RTL) code of the specific circuit by using a special hardware description language, and generates code that can be understood by a computer. After the code is generated, correctness of a code design needs to be repeatedly checked through simulation verification strictly based on an established specification and standard. Then, the RTL code written by using the hardware description language is converted into a gate-level netlist by using a logic synthesis tool, to ensure that the circuit meets a standard of a target parameter such as an area or timing. After a logic synthesis is completed, a static timing analysis needs to be performed, and a specific timing model is applied to analyze whether a specific circuit violates a timing limit given by the designer. The entire design procedure is an iterative procedure. When any step cannot meet a requirement, previous steps need to be repeated, and the RTL code even needs to be designed again. The back-end design is to arrange and wire the circuit within a silicon wafer area of a given size based on the netlist, and then perform various functional and timing verification on a physical layout of wiring. The back-end design is also an iterative procedure. If it is verified that a requirement is not met, previous steps need to be repeated. Finally, a graphic data stream (GDS) file to be used to produce the chip is generated.

In some embodiments of the present invention, the netlist corresponding to the circuit may be generated based on the design database of the circuit. The netlist includes a circuit description statement of the circuit including, for example, a connection mode of the circuit, or an attribute, a parameter, identification information, or the like of an element, a component, a power supply node, or the like.

Step S302: Search the netlist corresponding to the circuit for each of the sequential logic elements based on a preset keyword.

In some embodiments of the present invention, a keyword of identification information corresponding to each of the sequential logic elements of the circuit may be predetermined. For example, if identification information corresponding to all latches of the circuit generally includes a keyword "Latch", all the latches may be found from the netlist corresponding to the circuit by using the keyword "Latch". Similarly, if identification information corresponding to all flip-flops of the circuit generally includes a keyword "FF," all the flip-flops may be found from the netlist corresponding to the circuit by using the keyword "FF".

Step S303: Configure a performance check file corresponding to each of the sequential logic elements.

In some implementations, the performance check file corresponding to each of the sequential logic elements may be configured based on a chktiming statement.

In some embodiments, ideal output data, an ideal output delay, or the like of the sequential logic element may be specified in the performance check file.

The performance check file may be identified by using a simulation tool used in this embodiment of the present invention. In some embodiments, the simulation tool may be a finesim simulator.

In this embodiment of the present invention, the performance check file corresponding to each of the sequential logic elements is configured, to automatically check a performance parameter of the sequential logic element. Compared with a manual check manner, techniques in this embodiment not only save time and labor, but also provide higher accuracy.

Step S304: Separately simulate to obtain a simulation result, by using a plurality of simulation waveforms, the circuit based on the performance check file corresponding to each of the sequential logic elements.

The performance check file is used to check, in a simulation process, whether a target characteristic parameter of each of the sequential logic elements meets a preset condition, and identification information of a target sequential logic element having a target characteristic parameter that does not meet the preset condition is output in the simulation result.

In some implementations, a proper clock signal and input data signal may be selected in advance, and the circuit may be simulated based on the performance check file corresponding to each of the sequential logic elements.

In the simulation process of the circuit, each of the sequential logic elements may sample the input data signal based on the clock signal.

To better understand this embodiment of the present invention, a setup time is used as an example for target characteristic parameter. In some embodiments of the present invention, the performance check file may be used to monitor output data of the sequential logic element or an output delay of the sequential logic element, and then the output data of the sequential logic element or the output delay of the sequential logic element is compared with output data or an output delay threshold specified in the performance check file. If the output data of the sequential logic element is different from the output data specified in the performance check file corresponding to the sequential logic element, or the output delay of the sequential logic element is greater than the output delay threshold specified in the performance check file corresponding to the sequential logic element, it may be determined that a setup time of the sequential logic element does not meet the preset condition.

When any sequential logic element determines that a target characteristic parameter corresponding to the sequential logic element does not meet the preset condition, identification information corresponding to the sequential logic element is output in the simulation result, so that a design engineer views the identification information.

In some embodiments, the target sequential logic element output in the simulation result may be determined as a sequential logic element that may potentially have a timing error, for example, a sequential logic element having an insufficient setup time or hold time.

For example, when the setup time of the sequential logic element is sufficient, the data signal is stable when an active clock signal edge arrives. Therefore, a clock to output delay of the sequential logic element is small and has a stable value. When the setup time of the sequential logic element is insufficient, the data signal may not be in a stable state when an active clock signal edge arrives. Therefore, a clock to output delay of the sequential logic element also increases. In addition, a more insufficient setup time results in a greater clock to output delay of the sequential logic element. When the setup time of the sequential logic element is reduced to a value resulting in a case in which a target sampling value cannot be collected when the active clock signal edge arrives, the sequential logic element fails to output the target sampling value. In this case, the clock to output delay of the sequential logic element is zero.

Step S305: Determine a smallest target characteristic parameter corresponding to target sequential logic elements on a same path in the simulation result and a target simulation waveform corresponding to the smallest target characteristic parameter.

In some embodiments, the same path is a hierarchy of one example flip-flop or latch.

Step S306: Determine, based on the target simulation waveform, whether a timing error exists in the target sequential logic elements on the same path. An input signal of the target sequential logic elements on the same path is adjusted in the design database of the circuit if a timing error exists in the target sequential logic elements on the same path; and the procedure ends if no timing error exists in the target sequential logic elements on the same path.

For example, the target characteristic parameter is the setup time. When the circuit is separately simulated by using the plurality of simulation waveforms, there is a difference in a setup time corresponding to the target sequential logic element output in the simulation result. A smaller setup time leads to a larger probability that a timing error exists in the sequential logic element. Therefore, to improve check efficiency, the smallest target characteristic parameter corresponding to the target sequential logic elements on the same path in the simulation result and the simulation waveform corresponding to the smallest target characteristic parameter may be selected to analyze whether a timing error exists in the target sequential logic elements on the same path.

In some implementations, when it is determined that a timing error exists in the target sequential logic elements on the same path, a clock signal and/or a data input signal corresponding to the target sequential logic elements on the same path may be adjusted in the design database of the circuit.

In some embodiments, the input data signal may be advanced, and/or the clock signal may be delayed.

According to the method for determining performance of sequential logic elements in this embodiment of the present invention, after the simulation result is obtained, the smallest target characteristic parameter corresponding to the target sequential logic elements on the same path in the simulation result and the simulation waveform corresponding to the smallest target characteristic parameter are determined, and whether a timing error exists in the target sequential logic elements on the same path is determined based on the simulation waveform, to effectively improve check efficiency of the sequential logic element.

Figure 4:
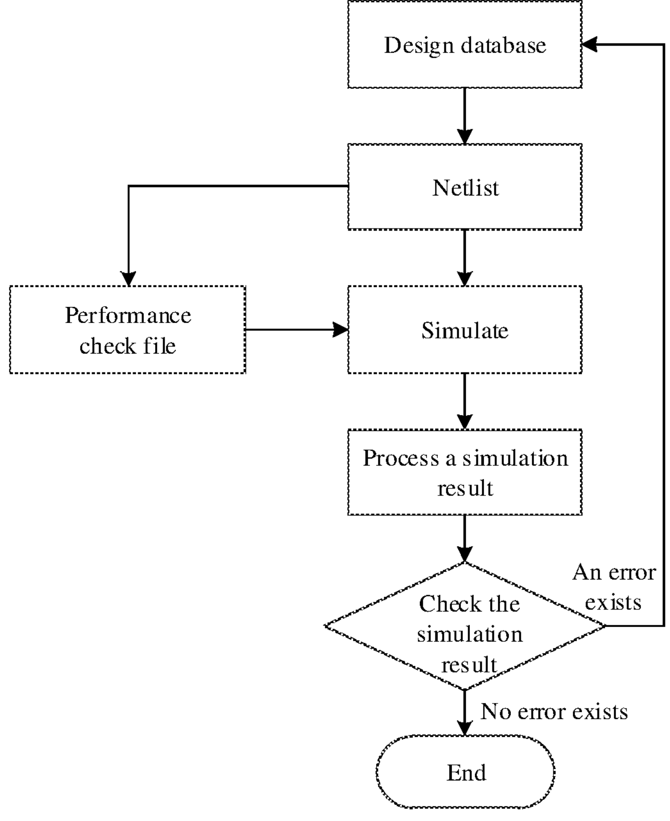
FIG. 4 is a schematic flowchart of steps of still another method for determining performance of sequential logic elements according to an embodiment of the present invention.

FIG. 4 is a schematic flowchart of steps of still another method for determining performance of sequential logic elements according to an embodiment of the present invention. In some embodiments of the present invention, the method for determining performance of sequential logic elements includes the following steps.

1. Obtain a design database of a circuit.
2. Generate a netlist based on the design database.
3. Generate a performance check file corresponding to the sequential logic elements based on the netlist.

In some implementations, each of the sequential logic elements may be found from the netlist based on a preset keyword, and the performance check file corresponding to each of the sequential logic elements may be configured.

4. Simulate the circuit.

In some implementations, the circuit is separately simulated to obtain the simulation result, by using a plurality of simulation waveforms, based on the performance check file corresponding to each of the sequential logic elements.

The performance check file may be used to check, in a simulation process, whether a target characteristic parameter of each of the sequential logic elements meets a preset condition, and identification information of a target sequential logic element having a target characteristic parameter that does not meet the preset condition is output in the simulation result.

5: Process the simulation result.

In some implementations, a smallest target characteristic parameter corresponding to target sequential logic elements on a same path in the simulation result and a simulation waveform corresponding to the smallest target characteristic parameter are determined.

6. Check the simulation result.

In some implementations, whether a timing error exists in the target sequential logic elements on the same path is determined based on the target simulation waveform.

An input signal of the target sequential logic elements on the same path in the design database is adjusted when it is determined that a timing error exists in the target sequential logic elements on the same path; and a check procedure ends when it is determined that no timing error exists in the target sequential logic elements on the same path.

According to the method for determining performance of sequential logic elements in this embodiment of the present invention, a sequential logic element having a timing error in the circuit may be quickly found. Compared with a manual check manner, techniques in this embodiment not only save time and labor, but also provide higher accuracy, so that efficiency of designing an integrated circuit can be effectively improved.

Based on the content described in the foregoing embodiments, an embodiment of the present invention provides an apparatus for determining performance of sequential logic elements of a circuit.

Figure 5:
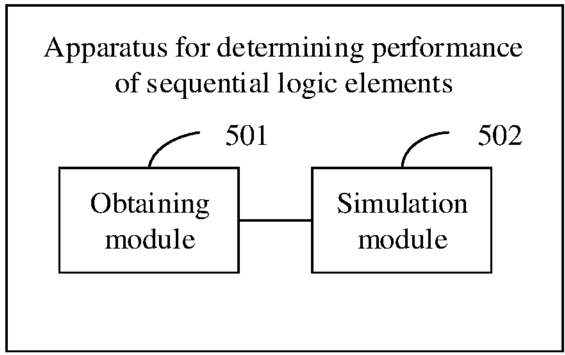
FIG. 5 is a schematic diagram of program modules of an apparatus for determining performance of sequential logic elements according to an embodiment of the present invention.

FIG. 5 is a schematic diagram of program modules of an apparatus for determining performance of sequential logic elements according to an embodiment of the present invention. The apparatus for determining performance of sequential logic elements includes: an obtaining module 501, configured to obtain a performance check file corresponding to each of the sequential logic elements; and a simulation module 502, configured to separately simulate to obtain a simulation result, by using a plurality of simulation waveforms, a circuit based on the performance check file corresponding to each of the sequential logic elements, where the performance check file is used to check, in a simulation process, whether a target characteristic parameter of each of the sequential logic elements meets a preset condition, and where identification information of a target sequential logic element having a target characteristic parameter that does not meet the preset condition is output in the simulation result.

In some embodiments, the apparatus further includes a configuration module, configured to: generate a netlist corresponding to the circuit based on a design database of the circuit; search the netlist corresponding to the circuit for each of the sequential logic elements based on a preset keyword; and configure the performance check file corresponding to each of the sequential logic elements.

In some embodiments, the apparatus further includes a processing module, configured to: determine a smallest target characteristic parameter corresponding to target sequential logic elements on a same path in the simulation result and a target simulation waveform corresponding to the smallest target characteristic parameter; and determine, based on the target simulation waveform, whether a timing error exists in the target sequential logic elements on the same path.

In some embodiments, the apparatus further includes an adjustment module, configured to: adjust an input signal of the target sequential logic elements on the same path when it is determined that a timing error exists in the target sequential logic elements on the same path.

In some embodiments, the adjustment module is specifically configured to: adjust a clock signal and/or a data input signal corresponding to the target sequential logic elements on the same path.

It should be noted that for content that is specifically executed by the obtaining module 501 and the simulation module 502 in this embodiment of the present invention, refer to related content in embodiments shown in FIG. 2 to FIG. 4. Details are not described herein again.

According to the apparatus for determining performance of sequential logic elements in this embodiment of the present invention, to check the circuit, the performance check file corresponding to each of the sequential logic elements of the circuit is obtained; and the circuit is separately simulated to obtain the simulation result, by using the plurality of simulation waveforms, based on the performance check file corresponding to each of the sequential logic elements. The performance check file may be used to determine, in the simulation process, whether the target characteristic parameter of each of the sequential logic elements meets the preset condition, and the identification information of the target sequential logic element having the target characteristic parameter that does not meet the preset condition is output in the simulation result. Compared with a manual check manner, techniques in the present invention not only save time and labor, but also provide higher accuracy, so that efficiency of designing an integrated circuit can be effectively improved.

Further, based on the content described in the foregoing embodiments, an embodiment of the present invention further provides an electronic device. The electronic device includes at least one processor and a memory. The memory stores computer-executable instructions, and the at least one processor executes the computer-executable instructions stored in the memory, to implement the steps of the method for determining performance of sequential logic elements in the foregoing embodiments. Details are not described herein again.

Figure 6:
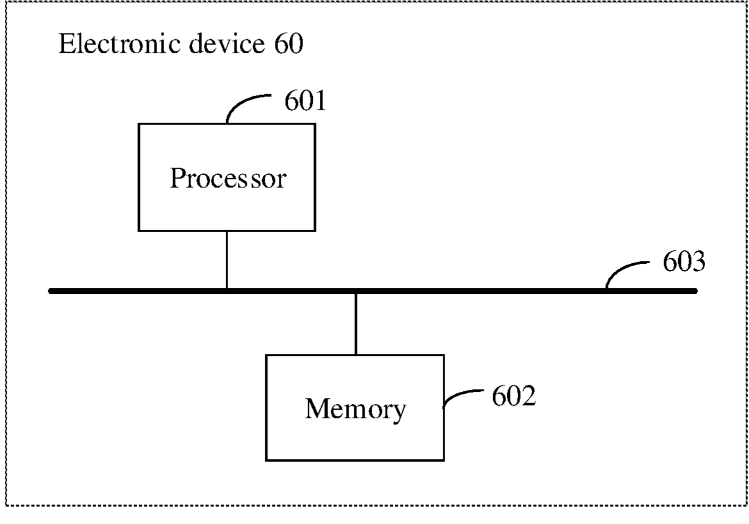
FIG. 6 is a schematic diagram of a hardware structure of an electronic device according to an embodiment of the present invention.

To better understand embodiments of the present invention, FIG. 6 is a schematic diagram of a hardware structure of an electronic device according to an embodiment of the present invention.

As shown in FIG. 6, an electronic device 60 in this embodiment includes a processor 601 and a memory 602.

The memory 602 is configured to store computer-executable instructions.

The processor 601 is configured to execute the computer-executable instructions stored in the memory, to implement the steps of the method for determining performance of sequential logic elements in the foregoing embodiments. For details, refer to related descriptions in the method embodiments.

In some embodiments, the memory 602 may be independent, or may be integrated with the processor 601.

When the memory 602 is independently disposed, the device further includes a bus 603, configured to connect the memory 602 and the processor 601.

Further, based on the content described in the foregoing embodiments, an embodiment of the present invention further provides a computer-readable storage medium. The computer-readable storage medium stores computer-executable instructions. When a processor executes the computer-executable instructions, the steps of the method for determining performance of sequential logic elements in the foregoing embodiments are implemented. Details are not described herein again in this embodiment.

Further, based on the content described in the foregoing embodiments, an embodiment of the present invention further provides a computer program product. The computer program product stores computer-executable instructions. When a processor executes the computer execution instructions, the steps of the method for determining performance of sequential logic elements in the foregoing embodiments are implemented. Details are not described herein again in this embodiment.

In the several embodiments provided in the present invention, it should be understood that the disclosed device and method may be implemented in another manner. For example, the described device embodiment is merely an example. For example, division into modules is merely logical function division, and may be other division in an actual implementation. For example, a plurality of modules may be combined or integrated into another system, or some features may be ignored or not performed. In addition, the displayed or discussed mutual couplings or direct couplings or communication connections may be implemented through some interfaces. An indirect coupling or communication connection between apparatuses or modules may be implemented in an electronic, mechanical, or another form.

The modules described as separate parts may or may not be physically separate, and parts displayed as modules may or may not be physical units, may be located in one place, or may be distributed on a plurality of network units. Some or all of the modules may be selected based on an actual requirement, to achieve objectives of the solutions of embodiments in this invention.

In addition, functional units in embodiments of the present invention may be integrated into one processing unit, or each of the modules may exist alone physically, or two or more modules are integrated into one unit. The units into which the modules are integrated may be implemented in a form of hardware, or may be implemented in a form of hardware in addition to a software functional unit.

Finally, it should be noted that embodiments are merely intended for describing the technical solutions of the present invention, but not for limiting the technical solutions of the present invention. Although the present invention is described in detail with reference to embodiments, persons of ordinary skill in the art should understand that they may still make modifications to the technical solutions described in embodiments or make equivalent replacements to some or all technical features thereof, without departing from the scope of the technical solutions of embodiments of the invention.

What is claimed is:

1. A method for determining performance of sequential logic elements of a circuit, the method comprising:

obtaining a performance check file corresponding to each of the sequential logic elements;

separately simulating the circuit based on the performance check file corresponding to each of the sequential logic elements to obtain a simulation result, by using a plurality of different simulation waveforms, wherein the plurality of different simulation waveforms comprise different clock signals and different input data signals, wherein the performance check file is used to check, in a simulation process, whether a target characteristic parameter of each of the sequential logic elements meets a preset condition, and wherein identification information of a target sequential logic element having a target characteristic parameter that does not meet the preset condition is output in the simulation result;

determining a smallest target characteristic parameter corresponding to target sequential logic elements on a same path in the simulation result and a target simulation waveform corresponding to the smallest target characteristic parameter;

determining, based on the target simulation waveform, whether a timing error exists in the target sequential logic elements on the same path; and adjusting an input signal of the target sequential logic elements on the same path when it is determined that a timing error exists in the target sequential logic elements on the same path.

2. The method according to claim 1, wherein before the obtaining a performance check file corresponding to each of the sequential logic elements, the method further comprises:

generating a netlist corresponding to the circuit based on a design database of the circuit;

searching the netlist corresponding to the circuit for each of the sequential logic elements based on a preset keyword; and configuring the performance check file corresponding to each of the sequential logic elements.

3. The method according to claim 1, wherein the sequential logic elements comprise a flip-flop and/or latch; and the target characteristic parameter comprises a setup time and/or a hold time.

4. The method according to claim 3, wherein the adjusting an input signal of the target sequential logic elements on the same path comprises:

adjusting a clock signal and/or a data input signal corresponding to the target sequential logic elements on the same path.

5. An electronic device, comprising at least one processor and a memory, wherein the memory stores computer-executable instructions; and the at least one processor executes the computer-executable instructions stored in the memory to perform operations comprising:

obtaining a performance check file corresponding to each of sequential logic elements of a circuit;

separately simulating the circuit based on the performance check file corresponding to each of the sequential logic elements to obtain a simulation result, by using a plurality of different simulation waveforms, wherein the plurality of different simulation waveforms comprise different clock signals and different input data signals, wherein the performance check file is used to check, in a simulation process, whether a target characteristic parameter of each of the sequential logic elements meets a preset condition, and wherein identification information of a target sequential logic element having a target characteristic parameter that does not meet the preset condition is output in the simulation result;

determining a smallest target characteristic parameter corresponding to target sequential logic elements on a same path in the simulation result and a target simulation waveform corresponding to the smallest target characteristic parameter;

determining, based on the target simulation waveform, whether a timing error exists in the target sequential logic elements on the same path; and adjusting an input signal of the target sequential logic elements on the same path when it is determined that a timing error exists in the target sequential logic elements on the same path.

6. The electronic device according to claim 5, wherein before the obtaining a performance check file corresponding to each of the sequential logic elements, the operations further comprise:

generating a netlist corresponding to the circuit based on a design database of the circuit;

searching the netlist corresponding to the circuit for each of the sequential logic elements based on a preset keyword; and configuring the performance check file corresponding to each of the sequential logic elements.

7. The electronic device according to claim 5, wherein the sequential logic elements comprise a flip-flop and/or latch; and the target characteristic parameter comprises a setup time and/or a hold time.

8. The electronic device according to claim 7, wherein the adjusting an input signal of the target sequential logic elements on the same path comprises:

adjusting a clock signal and/or a data input signal corresponding to the target sequential logic elements on the same path.

9. A non-transitory computer-readable storage medium, wherein the computer-readable storage medium stores computer-executable instructions, and when a processor executes the computer-executable instructions, the computer-executable instructions cause the processor to perform operations comprising:

obtaining a performance check file corresponding to each of sequential logic elements of a circuit;

separately simulating the circuit based on the performance check file corresponding to each of the sequential logic elements to obtain a simulation result, by using a plurality of different simulation waveforms, wherein the plurality of different simulation waveforms comprise different clock signals and different input data signals, wherein the performance check file is used to check, in a simulation process, whether a target characteristic parameter of each of the sequential logic elements meets a preset condition, and wherein identification information of a target sequential logic element having a target characteristic parameter that does not meet the preset condition is output in the simulation result;

determining a smallest target characteristic parameter corresponding to target sequential logic elements on a same path in the simulation result and a target simulation waveform corresponding to the smallest target characteristic parameter;

determining, based on the target simulation waveform, whether a timing error exists in the target sequential logic elements on the same path; and adjusting an input signal of the target sequential logic elements on the same path when it is determined that a timing error exists in the target sequential logic elements on the same path.

10. The non-transitory computer-readable storage medium according to claim 9, wherein before the obtaining a performance check file corresponding to each of the sequential logic elements, the operations further comprise:

generating a netlist corresponding to the circuit based on a design database of the circuit;

searching the netlist corresponding to the circuit for each of the sequential logic elements based on a preset keyword; and configuring the performance check file corresponding to each of the sequential logic elements.

11. The non-transitory computer-readable storage medium according to claim 9, wherein the sequential logic elements comprise a flip-flop and/or latch; and the target characteristic parameter comprises a setup time and/or a hold time.

12. The non-transitory computer-readable storage medium according to claim 11, wherein the adjusting an input signal of the target sequential logic elements on the same path comprises:

adjusting a clock signal and/or a data input signal corresponding to the target sequential logic elements on the same path.

* * * * *